(12) United States Patent
Kuznetsov et al.

(10) Patent No.: US 9,773,578 B2
(45) Date of Patent: Sep. 26, 2017

(54) RADIATION SOURCE-COLLECTOR AND METHOD FOR MANUFACTURE

(71) Applicant: ASML Netherlands B.V., Veldhoven (NL)

(72) Inventors: Alexey Sergeevich Kuznetsov, Zaltbommel (NL); Arjen Boogaard, Nijmegen (NL); Jeroen Marcel Huijbregtse, Breda (NL); Andrey Nikipelov, Eindhoven (NL); Maarten Van Kampen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 14/765,367

(22) PCT Filed: Jan. 14, 2014

(86) PCT No.: PCT/EP2014/050552
§ 371 (c)(1),
(2) Date: Aug. 3, 2015

(87) PCT Pub. No.: WO2014/124769
PCT Pub. Date: Aug. 21, 2014

(65) Prior Publication Data
US 2016/0012929 A1    Jan. 14, 2016

Related U.S. Application Data

(60) Provisional application No. 61/765,108, filed on Feb. 15, 2013, provisional application No. 61/826,754, (Continued)

(51) Int. Cl.
*G21K 1/06*    (2006.01)
*G03F 7/20*    (2006.01)
(Continued)

(52) U.S. Cl.
CPC .............. *G21K 1/062* (2013.01); *B82Y 10/00* (2013.01); *C23C 28/34* (2013.01);
(Continued)

(58) Field of Classification Search
None
See application file for complete search history.

(56) References Cited

U.S. PATENT DOCUMENTS 5,319,695 A  *  6/1994  Itoh ........................ G21K 1/062
                                                          378/145
6,160,867 A     12/2000  Murakami
(Continued)

FOREIGN PATENT DOCUMENTS

DE    10 2011 003357 A1     8/2012
DE    102011003357 A1  *   8/2012  ........... G02B 5/0875
(Continued)

OTHER PUBLICATIONS

Rigato et al. "Effects of ion bombardment and gas incorporation on the properties of Mo/a-Si:H multilayers for EUV applications", Surface and Coatings Technology 174-175 (2003).*
(Continued)

*Primary Examiner* — Michael Logie
(74) *Attorney, Agent, or Firm* — Sterne, Kessler, Goldstein & Fox P.L.L.C.

(57) ABSTRACT

A method of manufacturing a multi-layer mirror comprising a multi-layer stack of pairs of alternating layers of a first material and silicon, the method comprising depositing a stack of pairs of alternating layers of the first material and layers of silicon, the stack being supported by a substrate and doping at least a first layer of the first material with a dopant material.

17 Claims, 6 Drawing Sheets

Related U.S. Application Data filed on May 23, 2013, provisional application No. 61/867,796, filed on Aug. 20, 2013.

(51) Int. Cl.
| | | |
|---|---|---|
| *H05G 2/00* | (2006.01) | |
| *B82Y 10/00* | (2011.01) | |
| *C23C 28/00* | (2006.01) | |
| *G03F 1/24* | (2012.01) | |

(52) U.S. Cl.
CPC ......... *G03F 7/70033* (2013.01); *H05G 2/008* (2013.01); *G03F 1/24* (2013.01); *G21K 2201/067* (2013.01)

(56) References Cited

U.S. PATENT DOCUMENTS

| | | | |
|---|---|---|---|
| 2001/0038953 A1 | 11/2001 | Tsukamoto et al. | |
| 2003/0198814 A1* | 10/2003 | Khieu | G02B 5/124 428/412 |
| 2004/0121134 A1* | 6/2004 | Bijkerk | B82Y 10/00 428/212 |
| 2004/0233535 A1* | 11/2004 | Quesnel | B82Y 10/00 359/586 |
| 2008/0236842 A1* | 10/2008 | Bhavsar | E21B 41/02 166/381 |
| 2013/0341204 A1* | 12/2013 | Sung | C25B 9/10 205/626 |

FOREIGN PATENT DOCUMENTS

| | | |
|---|---|---|
| EP | 0 567 022 A1 | 10/1993 |
| JP | 2002-050794 A | 2/2002 |
| JP | 2008-101916 A | 5/2008 |
| NL | WO 2011117009 A1 * | 9/2011 ............ B82Y 10/00 |
| NL | WO 2011147628 A1 * | 12/2011 ............ B82Y 10/00 |
| WO | WO 93/09545 A1 | 5/1993 |
| WO | WO 2011/147628 A1 | 12/2011 |
| WO | WO 2012/104136 A1 | 8/2012 |
| WO | WO 2013/131648 A1 | 9/2013 |

OTHER PUBLICATIONS

Gawlitza et al., "DLC/Si multilayer mirrors for EUV radiation", Advances in X-ray/EUV Optics and Components, 2010.*

Soer et al., "Extreme ultraviolet multilayer mirror with near-zero IR reflectance", Optics Letters, vol. 34, No. 23, Dec. 2009.*

International Search Report directed to related International Patent Application No. PCT/EP2014/050552, mailed Apr. 15, 2014; 6 pages.

International Preliminary Report on Patentability and Written Opinion of the International Searching Authority directed to related International Patent Application No. PCT/EP2014/050552, issued Aug. 18, 2015; 10 pages.

Aramaki, F., et al., "Development of new FIB technology for EUVL mask repair," Proceedings of SPIE: Extreme Ultraviolet (EUV) Lithography II, vol. 7969, 2011; pp. 79691C-1 to 79691C-7.

Klaver, P., et al., "Molecular Dynamics Simulations of Growth and Low-Ebergy Ion Polishing of Thin Molybdenum Films for EUV Multilayer Mirrors," Materials Research Society Symposium Proceedings, vol. 585, Nov. 1999; 6 pages.

Löhmann, M., et al., "Structural investigations on ultrathin Mo layers in a Si:H with emphasis on the island-continuous layer transition," Thin Solid Films, vol. 342, 1999; pp. 127-135.

Schlatmann, R., et al., "Enhanced reflectivity of soft x-ray multilayer mirrors by reduction of Si atomic density," Applied Physics Letters, vol. 63, No. 24, Dec. 13, 1993; pp. 3297-3299.

\* cited by examiner

RADIATION SOURCE-COLLECTOR AND METHOD FOR MANUFACTURE

CROSS-REFERENCE TO RELATED APPLICATIONS

This application claims the benefit of U.S. provisional application 61/765,108, which was filed on Feb. 15, 2013, U.S. provisional application 61/826,754 which was filed on May 23, 2013 and U.S. provisional application 61/867,796 which was filed on Aug. 20, 2013, respectively, and which are incorporated herein in their entirety by reference

FIELD

The present invention relates to methods for manufacturing multi-layer mirrors for use in lithographic apparatus, such mirrors per se, and lithographic apparatus including such mirrors.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, k1 is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of k1.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a radiation source for containing the plasma. The plasma may be created, for example, by directing a laser beam at a fuel, such as particles of a suitable material (e.g., tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The radiation source may include an enclosing structure or chamber arranged to provide a vacuum environment to support the plasma. Such a radiation system is typically termed a laser produced plasma (LPP) source.

EUV collector mirrors, including grating collector mirrors are metal or metalloid or ceramic substrates coated with a molybdenum-silicon multi-layer stack for EUV radiation reflection purposes. The molybdenum-silicon multi-layer stack may be exposed to volatile species that are generated in the source, such as hydrogen ions. Continued exposure to volatile species such as hydrogen ions may result in the unintentional inclusion of hydrogen within the molybdenum-silicon layers. The unintentional inclusion of hydrogen may lead to the formation of blisters on the surface of the molybdenum-silicon multi-layer stack. The formation of such blisters can degrade the optical properties of the mirror, for example by reducing the reflectively, or altering the local focusing characteristics.

It is known to provide a capping layer at the surface of a molybdenum-silicon multi-layer stack, so as to block any ions from reaching the molybdenum-silicon layers. However, the use of a capping layer tends to reduce the reflectivity of the mirror. A further alternative is to increase the roughness at the interface between adjacent molybdenum-silicon layers. However, while having some beneficial effect by reducing the unintentional inclusion of hydrogen ions, this also reduces the reflectivity of the mirror surface.

What is needed is a multi-layer mirror that is resistant to blister formation during use in an EUV source.

SUMMARY

According to a first aspect of the invention there is provided a method of manufacturing a multi-layer mirror comprising a multi-layer stack of pairs of alternating layers of a first material and silicon, the method comprising; depositing a stack of pairs of alternating layers of a first material and layers of silicon, the stack being supported by a substrate, doping at least a first layer of the first material with a dopant material.

Unless specified to the contrary, doping shall be taken to mean the intentional incorporation of a dopant material into the structure of a material during the manufacturing process. In particular, doping does not include the unintentional inclusion of a contaminant material in a material for example, during use. For example, the intentional incorporation of atomic or molecular hydrogen (referred herein generically as "hydrogen") within a silicon layer during the deposition of the silicon layer, or during the manufacture of a component comprising the silicon layer is considered doping. However, the unintentional inclusion of hydrogen within a silicon layer during use of a component comprising the silicon layer is not considered doping.

Unless specified to the contrary, a dopant shall be taken to mean a dopant material that is intentionally incorporated into the structure of a material during manufacture. In particular, references to a dopant material are not intended to include a contaminant material that is unintentionally included in a material, for example, during use.

The doping of a layer of the first material within a multi-layer mirror during manufacture according to the first aspect of the present invention may prevent, or at least hinder to a significant extent, the subsequent unintentional inclusion of hydrogen within that layer of the first material during use in an environment such as that which may be found within an EUV source. In such an environment, hydrogen radicals or ions may be generated by an EUV-induced plasma. Hydrogen radicals or ions may then become included within the layers of the multi-layer mirror, eventually causing blisters on the surface of the mirror and degrading the performance of the mirror. It has surprisingly been found that doping one of more of the layers within the mirror can reduce the tendency for blistering by preventing, or at least hindering, the unintentional inclusion of hydrogen within the multi-layer mirror.

The first material may be molybdenum. Molybdenum-silicon multi-layer mirrors provide surfaces that are reflective to EUV radiation. Alternatively, the first material may be carbon. A carbon-silicon multi-layer mirror may provide a mirror that has enhanced reflectivity when compared to a molybdenum-silicon multi-layer mirror.

The dopant material employed in the one or more layers of the first material may be hydrogen. The incorporation hydrogen into the first layer of the first material may provide a significant enhancement of the ability of that layer of the first material to resist the unintentional inclusion of further hydrogen during exposure of a mirror (including the layer of the first material) to hydrogen radicals or ions during use.

Doping may comprise incorporating at least 20 atomic percent hydrogen into the first layer of the first material. The incorporation of at least 20 atomic percent hydrogen into the first layer of the first material may provide a significant enhancement of the ability of that layer of the first material to resist the unintentional inclusion of hydrogen during exposure of a mirror (including the layer of the first material) to hydrogen radicals or ions during use.

Doping may comprise incorporating up to 40 atomic percent hydrogen into the first layer of the first material. The incorporation of up to 40 atomic percent hydrogen in the first layer of the first material may effectively saturate the layer of the first material with hydrogen, such that it cannot accept any further incident hydrogen.

The dopant material employed in the one or more layers of the first material may be a noble gas, such as, for example helium. Another noble gas that may be used as a dopant in layers of the first material is neon. The incorporation a noble gas into the first layer of the first material may provide a significant enhancement of the ability of that layer of the first material to resist the unintentional inclusion of hydrogen during exposure of a mirror (including the layer of the first material) to hydrogen radicals or ions during use.

Doping may comprise incorporating up to 10 atomic percent noble gas into the first layer of the first material. The incorporation of up to 10 atomic percent of a noble gas in the first layer of the first material may provide a significant enhancement of the ability of that layer of the first material to resist the unintentional inclusion of hydrogen during exposure of a mirror (including the layer of the first material) to hydrogen radicals or ions during use.

Doping may comprise incorporating the dopant material into the first layer of the first material during the deposition of the first layer of the first material. Doping during the deposition of the first layer of the first material allows the dopant material to be incorporated in the structure of the first layer of the first material in a stable way, such that the dopant material does not subsequently diffuse within the structure of the first material, and individual dopant atoms or molecules are bound within the structure of the first material.

Doping may comprise depositing the first layer of the first material in the presence of a gas phase dopant material. The use of a gas phase dopant material allows the use of conventional materials deposition techniques, modified only by the presence of a gas phase dopant. The concentration of the gas phase dopant may be altered to control the doping density within the first layer of the first material that is being doped.

Alternatively, doping may comprise irradiating the first layer of the first material with dopant ions or a dopant plasma during deposition.

In a further alternative, doping may comprise incorporating the dopant material into the first layer of the first material after the deposition of the first layer of the first material. For example, doping may comprise irradiating the first layer of the first material with dopant ions or a dopant plasma after it has been deposited, but before a subsequent silicon layer is deposited.

The first layer of the first material may be the layer of the first material that is disposed furthest from the substrate.

The structure of the multi-layer mirror comprises pairs of alternating layers of a first material and layers of silicon deposited upon a substrate. The silicon layer of the mirror that is furthest from the substrate (i.e., which is deposited last) has an exposed surface that defines the surface of the mirror. The surface of the mirror is that which first receives radiation that is incident on the mirror. The silicon layer that is furthest from the substrate has an underlying layer of the first material, together forming a pair. The pair that includes the silicon layer that is furthest from the substrate is the pair of layers that is furthest from the substrate. The layer of the first material within the pair that is furthest from the substrate is therefore the layer of the first material that is furthest from the substrate.

Alternatively the silicon layer, layer of the first material or pair that are furthest from the substrate may be referred to as the silicon layer, layer of the first material or pair that are closest to the surface of the mirror respectively.

Alternatively, the layers of the first material and layers of silicon may be reversed, such that the surface of the mirror is defined by the layer of the first material that is furthest from the substrate, and that that is deposited last.

The doping of the layer of the first material that is furthest from the substrate provides the most significant degree of protection for the mirror (compared with doping of other layers of the first material). This is because the layer of the first material closest to the surface of the mirror receives the largest fluence of hydrogen incident upon the mirror (i.e., more than other layers of the first material). Doping this layer, which receives the largest fluence of hydrogen, will not only prevent the unintentional inclusion of hydrogen in that layer, but also protect layers further from the surface (i.e., nearer to the substrate) from incident hydrogen, by preventing or restricting hydrogen from passing through the layer closest to the surface.

The method may further comprise doping at least a first silicon layer with hydrogen. The additional doping of a first silicon layer provides an additional level of protection from the unintentional inclusion of hydrogen during use of the multi-layer mirror. The dopant used in the first silicon layer may be the same or different to the dopant used in the first layer of the first material. Moreover, the way in which dopants are incorporated into the silicon layers and the layers of the first material may be the same or different.

The doping of a first silicon layer within a multi-layer mirror during manufacture may prevent or at least significantly hinder the subsequent unintentional inclusion of hydrogen within that silicon layer during use in an environment such as that which may be found within an EUV source. In such an environment, hydrogen radicals and ions may be generated by an EUV-induced plasma. Hydrogen radicals or ions may then become included within one or more of the silicon layers of the multi-layer mirror, eventually causing blisters on the surface of the mirror and degrading the performance of the mirror. It has unexpectedly been determined that the use of hydrogen as a dopant within one or more of the silicon layers within the mirror can prevent or at least hinder blistering by preventing or restricting the unintentional inclusion of further hydrogen within the silicon layers of the multi-layer mirror.

Doping may comprise incorporating at least 10 atomic percent hydrogen into the first silicon layer. The use of at least 10 atomic percent hydrogen within the first silicon layer significantly reduces or eliminates the capacity of the silicon to accept further hydrogen during use of the multi-layer mirror, preventing or at least significantly hindering any further unintentional inclusion of hydrogen during use.

Doping may comprise incorporating up to 30 atomic percent hydrogen into the first silicon layer. The incorporation of up to 30 atomic percent hydrogen in the first silicon layer may provide a significant enhancement of the ability of that silicon layer to resist the unintentional inclusion of hydrogen during exposure of a mirror including the silicon layer to hydrogen radicals or ions during use, by effectively saturating the silicon layer with hydrogen, such that it cannot accept any further incident hydrogen.

The first silicon layer may be the silicon layer that is disposed furthest from the substrate. The doping of the silicon layer that is furthest from the substrate provides the most significant degree of protection for the mirror that a single layer of silicon or any type of layer can provide. The silicon layer closest to the surface of the mirror receives the largest fluence of hydrogen incident upon the mirror of any layer (of silicon or of the first material) within the mirror. Doping this layer, which receives the largest fluence of hydrogen, will not only prevent or at least significantly restrict the unintentional inclusion of hydrogen in that layer, but also protect layers further from the surface from incident hydrogen by preventing or restricting hydrogen from passing through the layer closest to the surface.

Doping may comprise incorporating the hydrogen into the first silicon layer during the deposition of the first silicon layer. Doping during the deposition of the first silicon layer allows the dopant material to be incorporated in the structure of the silicon layer in a stable way, such that the dopant material does not subsequently diffuse within the structure of the first material, and individual dopant atoms or molecules are bound within the structure of the first material.

According to a second aspect of the invention, there is provided a multi-layer mirror comprising a multi-layer stack of pairs of alternating layers of a first material and layers of silicon. The stack is supported by a substrate, wherein at least a first layer of the first material is doped with a dopant material.

As noted above, the doping of the first layer of the first material within a multi-layer mirror during manufacture prevents or at least significantly restricts the subsequent unintentional inclusion of hydrogen within that layer of the first material during use in an environment such as that which may be found within an EUV source. The use of dopants within one or more layers making-up the mirror can prevent or at least hinder blistering by preventing or at least significantly restricting the unintentional inclusion of hydrogen within the layers of the multi-layer mirror.

The first material may be molybdenum. Molybdenum-silicon multi-layer mirrors provide surfaces that are reflective to EUV radiation. Alternatively, the first material may be carbon. A carbon-silicon multi-layer mirror may provide a surface that has improved performance when compared to a molybdenum-silicon multi-layer mirror.

The dopant material may be hydrogen. The incorporation of hydrogen into the first layer of the first material may provide a significant enhancement of the ability of that layer of the first material to resist the unintentional inclusion of hydrogen during exposure of a mirror (including the layer of the first material) to hydrogen radicals or ions during use.

The dopant material may represent at least 20 atomic percent hydrogen of the first layer of the first material. The incorporation of at least 20 atomic percent hydrogen into the first layer of the first material may provide a further enhancement of the ability of that layer of the first material to resist the unintentional inclusion of hydrogen during exposure of a mirror (including the layer of the first material) to hydrogen radicals or ions during use.

The dopant material may represent up to 40 atomic percent hydrogen of the first layer of the first material. The incorporation of up to 40 atomic percent hydrogen in the first layer of the first material may effectively saturate the layer of the first material with hydrogen, such that it cannot accept any further incident hydrogen.

The dopant material employed in the one or more layers of the first material may be a noble gas, such as, for example helium. Another noble gas that may be used as a dopant in layers of the first material is neon. The incorporation a noble gas into the first layer of the first material may provide a significant enhancement of the ability of that layer of the first material to resist the unintentional inclusion of hydrogen during exposure of a mirror (including the layer of the first material) to hydrogen radicals or ions during use.

The noble gas dopant material may represent up to 10 atomic percent of the first layer of the first material. The incorporation of up to 10 atomic percent of the noble gas in the first layer of the first material may provide a significant enhancement of the ability of that layer of the first material to resist the unintentional inclusion of hydrogen during exposure to hydrogen radicals or ions during use.

The first layer of the first material may be the layer of the first material that is disposed furthest from the substrate. As noted above, the doping of the layer of the first material that is furthest from the substrate (i.e., closest to the surface of the mirror) provides the most significant degree of protection for the mirror that a single layer of the first material can provide. The layer of the first material closest to the surface of the mirror receives the largest fluence of hydrogen incident upon the mirror of any layer of the first material within the mirror. Doping that layer may not only prevent or at least significantly restrict the unintentional inclusion of hydrogen in that layer, but also protect layers further from the surface from incident hydrogen by preventing or at least significantly restricting hydrogen from passing through the layer of the first material closest to the surface.

The multi-layer mirror may further comprise at least a first silicon layer that is doped with hydrogen. The additional doping of a first silicon layer may provide an additional level of protection from the unintentional inclusion of hydrogen during use of the multi-layer mirror. The dopant used in the silicon layer may be the same or different to the dopant used in the layer of the first material. Moreover, the way in which dopants are incorporated into the silicon layers and layers of the first material may be the same or different.

The doping of the first silicon layer within a multi-layer mirror during manufacture may prevent or at least significantly hinder the subsequent unintentional inclusion of hydrogen within that silicon layer during use in an environment such as that which may be found within an EUV source. In such an environment, hydrogen radicals and ions may be generated by an EUV-induced plasma. Hydrogen radicals or ions may then become included within one or more of the silicon layers of the multi-layer mirror, eventually causing blisters on the surface of the mirror and degrading the performance of the mirror. It has unexpectedly been determined that the use of hydrogen as a dopant within one or more of the silicon layers within the mirror can prevent or at least hinder blistering by preventing or restricting the unintentional inclusion of further hydrogen within the silicon layers of the multi-layer mirror.

Hydrogen may represent at least 10 atomic percent of the first silicon layer. The use of at least 10 atomic percent hydrogen within the first silicon layer significantly reduces the capacity of the silicon to accept further hydrogen during use of the multi-layer mirror, preventing any further significant unintentional inclusion of hydrogen during use.

Hydrogen may represent up to 30 atomic percent of the first silicon layer. The incorporation of up to 30 atomic percent hydrogen in the first silicon layer may provide a significant enhancement of the ability of that silicon layer to resist the unintentional inclusion of hydrogen during exposure of a mirror including the silicon layer to hydrogen radicals or ions during use, by effectively saturating the silicon layer with hydrogen, such that it cannot accept any further incident hydrogen.

The first silicon layer may be the silicon layer that is disposed furthest from the substrate. As noted above, the doping of the silicon layer furthest from the substrate provides the most significant degree of protection for the mirror that a single layer of silicon can provide. The silicon layer furthest from the substrate (i.e., closest to the surface of the mirror) receives the largest fluence of hydrogen incident upon the mirror of any silicon layer within the mirror. Doping this layer, which receives the largest fluence of hydrogen, not only prevents or significantly restricts the unintentional inclusion of hydrogen in that layer, but also protects layers further from the surface from incident hydrogen by preventing or at least significantly hindering hydrogen from passing through the layer closest to the surface of the mirror.

There is also provided a lithographic apparatus comprising a multi-layer mirror according to the second aspect of the invention.

According to a third aspect of the invention, there is provided a method of manufacturing a multi-layer mirror comprising a multi-layer stack of pairs of alternating layers of a first material and a second material, the method comprising; depositing a stack of pairs of alternating layers of the first material and layers of the second material, the stack being supported by a substrate, and doping at least a first layer of the first material with a first metallic dopant.

The method may further comprise depositing a capping layer on the multi-layer mirror. Such a capping layer may be combined with a material from the group consisting of $Al_2O_3$, $ZrO_2$, TiC and $B_4C$. Usage of such material in combination with a capping layer (e.g. a ZrN capping layer) may ensure that high accumulation of hydrogen is limited to the capping layer.

The method may further comprise doping the capping layer with a second metallic dopant.

The first metallic dopant may be different from the second metallic dopant.

The first metallic dopant may comprise one or more of W, Ti, V, Zr, Ni, Cu, Al, Cr, Au, Ag, Fe and Sn.

The second metallic dopant may comprise one or more of W, Ti, V, Zr, Ni, Cu, Al, Cr, Au, Ag, Fe and Sn.

The first material may comprise silicon.

The second material may comprise molybdenum.

According to a fourth aspect of the invention, there is provided a multi-layer mirror comprising a multi-layer stack of pairs of alternating layers of a first material and a second material, the stack being supported by a substrate, wherein at least a first layer of the first material is doped with a first metallic dopant.

The multi-layer mirror may further comprise a capping layer.

The capping layer may be doped with a second metallic dopant.

The first metallic dopant may be different from the second metallic dopant.

The first metallic dopant may comprise one or more of W, Ti, V, Zr, Ni, Cu, Al, Cr, Au, Ag, Fe and Sn.

The second metallic dopant may comprise one or more of W, Ti, V, Zr, Ni, Cu, Al, Cr, Au, Ag, Fe and Sn.

The first material may comprise silicon.

The second material may comprise molybdenum.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

Figure 1:
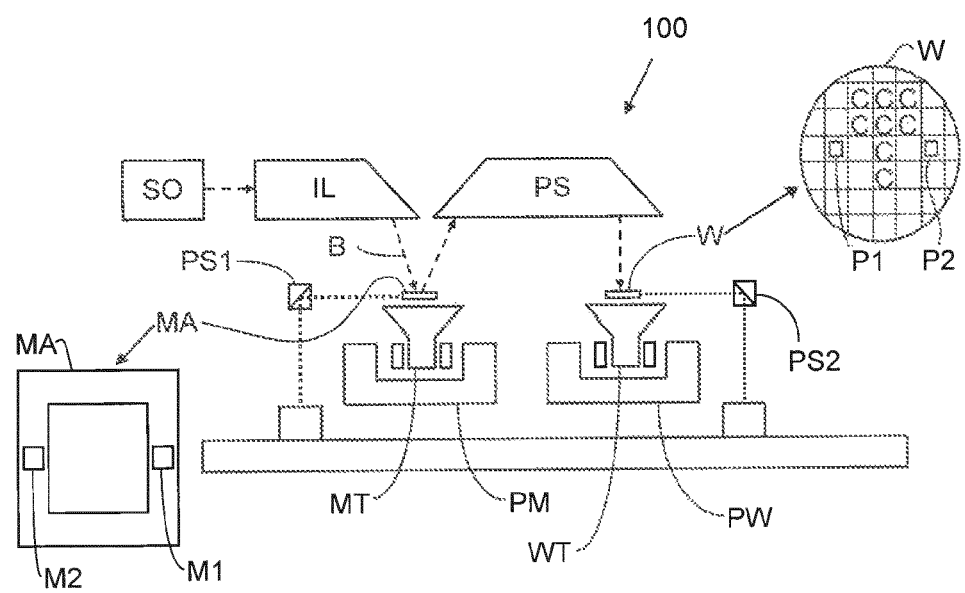
FIG. 1 depicts a lithographic apparatus according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, or structurally similar elements. The drawing in which an element first appears is indicated by the leftmost digit(s) in the corresponding reference number.

DETAILED DESCRIPTION

This specification discloses embodiments that incorporate the features of this invention. The disclosed embodiments merely exemplify the invention. The scope of the invention is not limited to the disclosed embodiments. The invention is defined by the claims appended hereto.

The embodiments described, and references in the specification to "one embodiment," "an embodiment," "an example embodiment," "some embodiments," etc., indicate that the embodiments described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

FIG. 1 schematically depicts a lithographic apparatus 100 including a radiation source SO according to one embodiment of the invention. The apparatus comprises:

an illumination system (illuminator) IL configured to condition a radiation beam B (e.g., EUV radiation);

a support structure (e.g., a mask table) MT constructed to support a patterning device (e.g., a mask or a reticle) MA and connected to a first positioner PM configured to accurately position the patterning device;

a substrate table (e.g., a wafer table) WT constructed to hold a substrate (e.g., a resist-coated wafer) W and connected to a second positioner PW configured to accurately position the substrate; and a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam that is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the radiation source SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The radiation source SO may be part of an EUV radiation system including a laser, not shown in FIG. 1, for providing the laser beam exciting the fuel. The resulting plasma emits output radiation, e.g., EUV radiation, which is collected using a radiation collector, disposed in the radiation source. The laser and the radiation source may be separate entities, for example when a $CO_2$ laser is used to provide the laser beam for fuel excitation.

In such cases, the laser is not considered to form part of the lithographic apparatus and the laser beam is passed from the laser to the radiation source with the aid of a beam delivery system comprising, for example, suitable directing mirrors and/or a beam expander.

In an alternative method, often termed discharge produced plasma ("DPP") the EUV emitting plasma is produced by using an electrical discharge to vaporise a fuel. The fuel may be an element such as xenon, lithium or tin that has one or more emission lines in the EUV range. The electrical discharge may be generated by a power supply that may form part of the radiation source or may be a separate entity that is connected via an electrical connection to the radiation source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:

1. In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
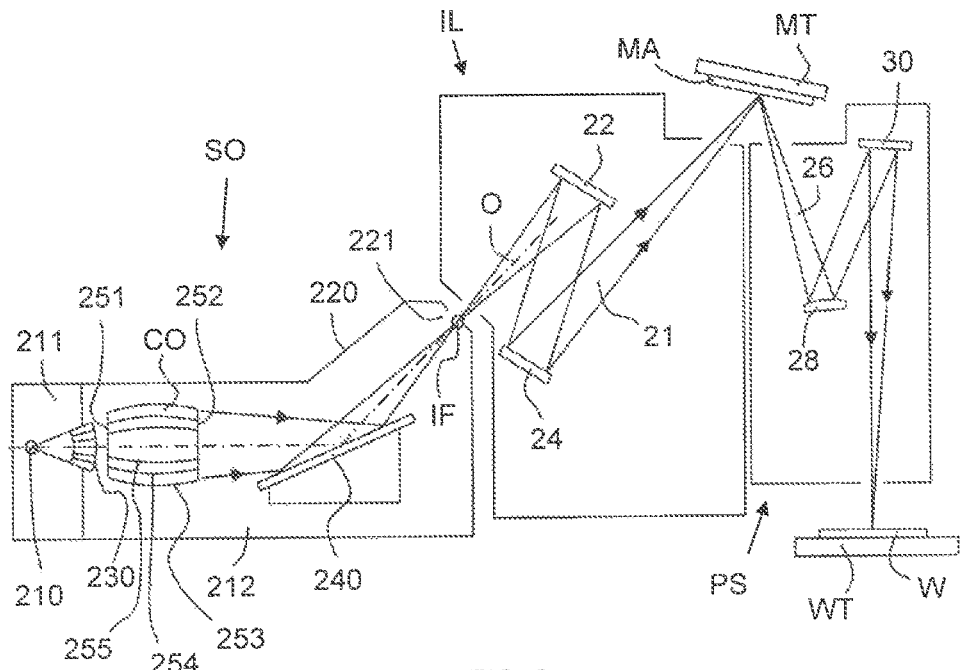
FIG. 2 is a more detailed view of the lithographic apparatus 100.

FIG. 2 shows the lithographic apparatus 100 in more detail, including the radiation source SO, the illumination system IL, and the projection system PS. The radiation source SO is constructed and arranged such that a vacuum environment can be maintained in an enclosing structure 220 of the radiation source SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap), which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 212 may include a radiation collector CO, which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the radiation source is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Figure 3:
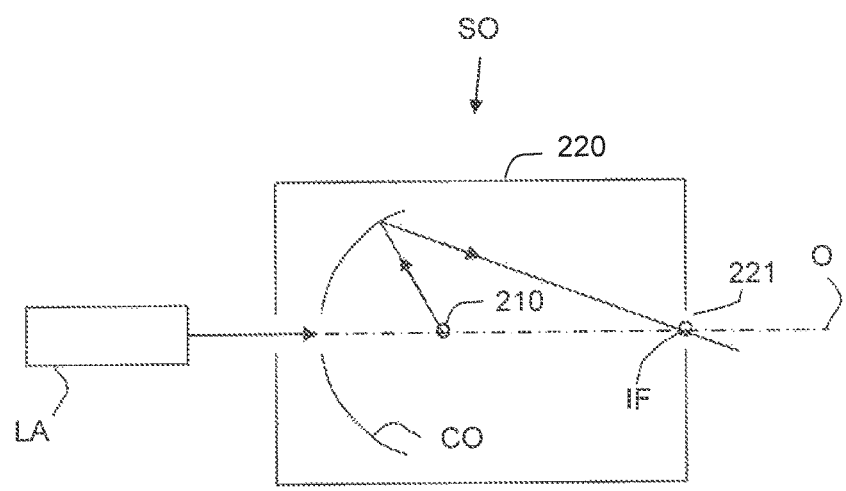
FIG. 3 is a more detailed view of the radiation source SO of the apparatus of FIGS. 1 and 2.

Alternatively, the radiation source SO may be part of an LPP radiation system as shown in FIG. 3. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

Figure 4:
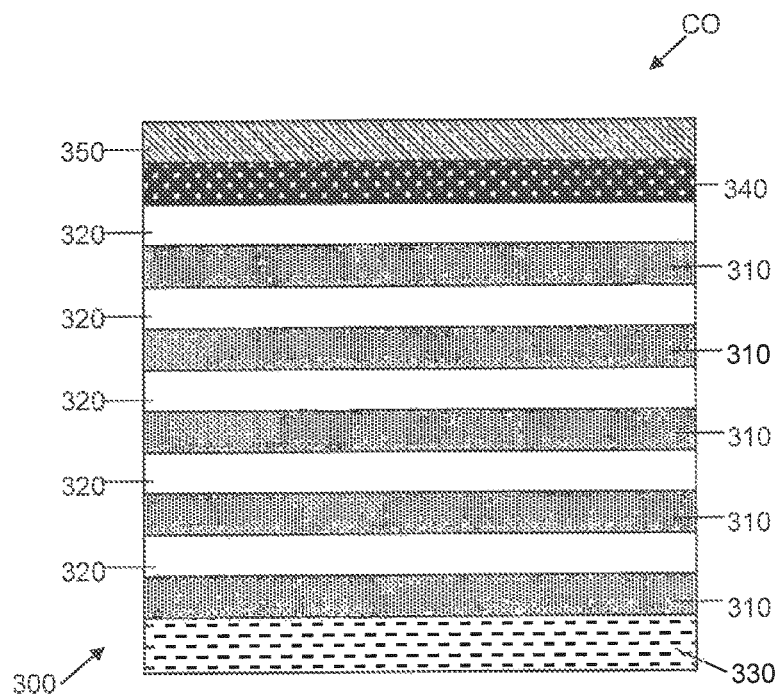
FIG. 4 schematically depicts a multi-layer mirror that may be used in the radiation source of FIG. 3 in accordance with an embodiment of the invention.

FIG. 4 schematically illustrates a first embodiment of a collector mirror 300 forming part of the normal incidence collector optic CO of FIG. 3. As illustrated, the collector optic CO includes a multi-layer mirror 300 according to an aspect of the invention that includes pairs of alternating layers of molybdenum 310 and silicon 320 to define a multi-layer stack on top of a substrate 330. The multi-layer mirror further includes a first doped silicon layer 340 and a first doped molybdenum layer 350. Generally, barrier layers (not shown in the drawings) may be provided between subsequent layers of molybdenum and silicon in order to avoid diffusion between these layers. Such a barrier layer may be made of boron carbide, for instance $B_4C$.

The multi-layer mirror 300 is of particular use as a collector mirror for a plasma source where hydrogen may be present within the plasma source in use. For instance, hydrogen may be used in an LPP source to provide scavenging of debris and deposits. Where such a collector mirror may have to be located close to the plasma source, there is risk in prior art mirrors of hydrogen impinging on the mirror and causing blistering. Any such damage may result in a loss of optical performance, by reducing the reflectivity of the multi-layer mirror 300, or degrading the optical focus of the multi-layer mirror 300. The multi-layer mirror 300 of the invention reduces or eliminates the risk of such blistering or degradation by incorporating dopants within the structure of the uppermost layers of the multi-layer mirror 300. The dopants act to block hydrogen from being unintentionally included into the layers of the multi-layer mirror 300 during use.

In conventional multi-layer mirrors it is known to protect the uppermost layer of silicon 320 in the multi-layer stack with a protective region that shields the multi-layer stack and substrate 330 from bombardment by hydrogen atoms or ions during use of the radiation source SO. However, in the present invention, the multi-layer stack is protected from hydrogen bombardment by incorporating hydrogen or dopant materials within one or more layers of the multi-layer mirror prior to exposure to the harsh operating conditions experienced during use within an EUV source.

As used herein, references to 'top', 'uppermost', 'outer' and 'inner' correspond to the arrangement depicted in the relevant Figure or Figures but are used merely for convenience; it is intended that reference to the 'uppermost' or 'top' layer of the collector optic CO refers to the layer that first receives radiation that is incident on the collector optic CO, and which is furthest from the substrate 330. Following this convention, 'lower' layers of the stack receive the incident radiation after 'upper' layers of the stack.

Manufacture of the multi-layer mirror of the invention may be carried out by standard multi-layer deposition methods, such as sputtering and/or chemical vapour deposition on to a substrate. However, during deposition, dopants are incorporated into the layers of silicon and/or molybdenum, so as to protect the layers from further inclusion of hydrogen species during use. For example, amorphous silicon (a-Si) may be deposited in a hydrogen rich environment, resulting in a hydrogenated amorphous silicon (a-Si:H) film. Where the a-Si film is deposited by sputtering, hydrogen gas can be added to the sputtering gas. Alternatively, where the a-Si film is deposited by CVD, such as by plasma enhanced chemical vapour deposition (PECVD), hydrogen may be incorporated by use of $SiH_4$ as a precursor gas, or by the use of $H_2$ as an additional precursor gas.

The concentration of hydrogen in a-Si films deposited in this way can reach 10-30 atomic percent (at. %). The inclusion of such high percentages of hydrogen during deposition effectively saturates the a-Si material, meaning that any further uptake of hydrogen during ion bombardment in normal use is prevented. In fact, studies performed on a-Si films show that the a-Si films have a limit to the amount of hydrogen they can incorporate. Once an a-Si film has received a predetermined hydrogen fluence, the amount of hydrogen retention does not continue to increase with further hydrogen fluence. This condition is used to prevent further hydrogen uptake during normal use of a multi-layer mirror by ensuring the a-Si layer has reached the effective hydrogen saturation capacity during manufacture of the mirror.

Furthermore, the inclusion of hydrogen during deposition, rather than after deposition, results in the incorporated hydrogen being bound to the structure of the a-Si in a stable way, such that the hydrogen does not subsequently diffuse within the structure of the a-Si, and individual dopant atoms or molecules are bound within the a-Si structure. For example, dangling silicon bonds may be terminated by hydrogen atoms.

Alternatively, molecular hydrogen may be incorporated into voids within the a-Si structure. Hydrogen included in this way will not diffuse within the a-Si material, preventing further movement of hydrogen ions or molecules. Experimental studies show that hydrogen incorporated in a-Si layers within a multi-layer stack in this way does not diffuse into adjacent layers. For example, in a mirror in which 30 at. % hydrogen was incorporated into an a-Si layer, inspection of the adjacent molybdenum layers revealed that only 0.5 at. % hydrogen was present in the molybdenum layers. This illustrates the extent to which the included hydrogen was stably bonded or at least bound within the a-Si structure.

By having hydrogen incorporated into the a-Si structure, further diffusion of hydrogen into the a-Si material is prevented or at least significantly restricted. A high initial concentration of hydrogen (e.g., 30 at. %) effectively saturates the a-Si material with hydrogen, preventing or at least significantly restricting it from accepting any more hydrogen even when bombarded with reactive ions, atoms or molecules from a hydrogen plasma to which it may be exposed.

While hydrogen incorporation during deposition has been demonstrated in a-Si deposition, the addition of hydrogen to the sputtering gas during magnetron sputtering of molybdenum does not yield a highly hydrogenated molybdenum film. In fact, there has been shown to be negligible hydrogen retention in molybdenum films deposited in this way. It has been shown by experiment that the addition of hydrogen to the sputtering gas during deposition of molybdenum films results in hydrogen concentrations of around 0.5 at. %. However, examination of molybdenum films that have been exposed to plasma conditions such as those experienced within an EUV source, have shown that significant amounts of hydrogen can be incorporated within the molybdenum material during normal use conditions. Hydrogen concentrations in molybdenum films of as high as 20 at. % have been observed under such conditions, with such high concentrations being related to blister formation on the surface of multi-layer mirrors. Therefore, the prevention of the uptake of hydrogen within molybdenum layers during use will prevent blister formation and the associated performance degradation. A similar approach to that taken with a-Si, that of effectively saturating the molybdenum with hydrogen during deposition, will prevent further uptake of hydrogen during use.

A hydrogen dopant concentration in molybdenum layers of between 20 and 40 at. % will protect the molybdenum layer from further unintentional inclusion of hydrogen during use. It has been shown in experimental studies that the hydrogen concentration in a molybdenum layer with 20 at. % hydrogen does not continue to increase under further exposure to hydrogen. Therefore doping a molybdenum layer with 20 at. % hydrogen during manufacture is likely to prevent any significant further unintentional inclusion of hydrogen during use. A hydrogen concentration of 40 at. % represents the maximum amount of hydrogen that is able to be incorporated into a molybdenum layer.

Hydrogen may be incorporated into the molybdenum film by exposing the growing molybdenum layer to a hydrogen plasma. Alternatively, hydrogen ions generated within a hydrogen plasma or ion source may be caused to be incident upon the molybdenum layer during the growth of the layer. A molybdenum layer, exposed to hydrogen during its formation may be effectively saturated with hydrogen. Once again, if an upper limit to the capacity of a molybdenum layer to incorporate hydrogen is reached, then further exposure to hydrogen cannot result in further hydrogen retention, and subsequent blister formation.

In use, hydrogen ions created in an EUV-induced plasma may be temporarily incorporated into a top silicon layer of a multi-layer stack in a mirror according to an embodiment of the present invention. However, if the silicon layer and adjacent molybdenum layer already contain as much hydrogen as they are able to support, with all possible trap sites already having been occupied, then any temporarily incorporated hydrogen species will not be retained within the multi-layer stack.

In addition to the use of hydrogen to saturate possible hydrogen trap sites within a multi-layer stack, it is possible to use other dopants in a similar way. For example, the inclusion of helium reduces the ability of molybdenum to accept hydrogen. By incorporating helium in stack layers, trap sites or vacancies that could otherwise receive hydrogen are occupied, preventing them from being able to receive hydrogen. Alternatively, other noble gases may perform the same function as the helium.

Noble gas dopant concentrations in molybdenum will operate effectively at lower concentrations than that of hydrogen dopants. For example, a concentration of up to 10 at. % helium protects the molybdenum layer from further unintentional inclusion of hydrogen during use.

Helium or other noble gases are incorporated into one or more layers of the multi-layer stack as the layers are deposited. This noble gas incorporation is accomplished by exposing the or each layer to a noble gas plasma or ion beam during deposition. Alternatively, it may be possible to incorporate sufficient noble gas within the structure of the layer simply by depositing the layer in an environment including that gas. Such gas-phase doping would provide a simple route to noble gas doping requiring, at most, minor modifications to existing deposition procedures. Further, the use of gas-phase doping would reduce the risk of incident ions from damaging the layer interface or internal structure.

A further alternative is to expose each layer of a multi-layer mirror to a low energy plasma or ion-beam of a dopant species once that layer has been deposited, before deposition of a subsequent layer. A post-doping annealing process may be required in some such treatments to allow the dopant species to penetrate the layer, rather than being disposed only at the surface of the layer. However, post-deposition layer-by-layer treatments that use high energy ions may cause damage to the deposited layer, and if so, should be avoided. Further, the use of a high level of doping, applied by post-deposition layer-by-layer techniques can itself cause blistering, an effect which the doping intends to prevent or at least significantly hinder. Therefore, such post-deposition layer-by-layer treatment to achieve a satisfactory level of dopant inclusion should be used with care.

The inclusion of hydrogen or other dopants, such as noble gases, in a stable bonding configuration can thus prevent the further uptake of hydrogen in use, and therefore prevent the formation of hydrogen blisters within the multi-layer mirror.

Alternative solutions to the problem of blistering in multi-layer mirrors, such as the provision of a capping layer, suffer from limited lifetime. The use of a capping layer may delay the onset of hydrogen blistering, by slowing down the rate at which hydrogen is incorporated into the underlying stack layers. However, it is likely that after prolonged exposure to the harsh operating conditions found within an EUV source (i.e., hydrogen plasma), even a capped multi-layer mirror will suffer from blistering due to the exposure to hydrogen. A multi-layer mirror with a capping layer may also need to be refurbished periodically, with the capping layer being removed and re-applied. Further, the use of a capping layer can reduce the initial reflectivity of the multi-layer stack. Any such reduction in reflectivity reduces the overall efficiency of the EUV source in which the mirror is used and so should be avoided where possible. However, it will be appreciated that a multi-layer mirror according to an embodiment of the invention may be provided with a capping layer.

A further effect of introducing dopants into the metal or metalloid layers within a multi-layer mirror can be to increase the reflectivity of the multi-layer mirror. It has been shown that hydrogen inclusion can enhance the reflectively of molybdenum-silicon multi-layer mirrors.

While the foregoing description considers only molybdenum-silicon multi-layer mirrors, it is possible that the molybdenum layers may be replaced with alternative materials as may be appropriate. Alternative materials may be selected in dependence on their refractive index. A contrast in refractive index between the alternative material and the silicon layer will determine the reflective properties of the multi-layer mirror at the particular wavelength of EUV radiation the mirror is intended to be used for. For example, the molybdenum layers may be replaced with carbon layers.

The doping processes as described with reference to molybdenum layers may also be applied to alternative layers, such as, for example, carbon layers.

It will be appreciated that the uppermost layer in a multi-layer mirror is subjected to the highest hydrogen fluence when the multi-layer mirror is exposed to a hydrogen plasma, followed by the layer directly underneath and so on. Each layer acts as a barrier to the migration of hydrogen, protecting the next layer in the stack to a certain extent. Therefore, while treating every layer in a multi-layer mirror would provide the highest level of protection from hydrogen inclusion and consequent blister formation, it is not necessary for every layer in a multi-layer mirror to be so treated for significant performance advantages to be brought about.

While FIG. 4 shows an embodiment in which the uppermost silicon layer 350 and uppermost molybdenum layer 340 are doped, by way of example, the 10 uppermost layers of each of the stack-pairs may be treated if further protection was required. It will be appreciated that if desired, it would be possible to dope every layer within a multi-layer stack in the way described above.

The performance benefit provided by the layer treatment should be considered in light of the associated cost of treatment. The cost associated with a treatment may be, for example, an extension of the time required to deposit each of the treated layers with respect to a conventional layer. Alternatively, the incorporation of dopants within a multi-layer mirror may introduce additional stress to the layers that contain dopants.

Therefore, it may be optimal to include a smaller number of doped layers than would be included if there were no negative effect, or cost, associated with the layer treatment. In this way, a compromise is sought between the advantage provided by doping of layers, and any negative consequences of the inclusion of additional doped layers. In some cases it may be beneficial to treat only the first layer-pair of the multi-layer mirror, as shown in FIG. 4. Alternatively, in some cases it may be beneficial to treat only the first two layer-pairs of the multi-layer mirror.

Figure 5:
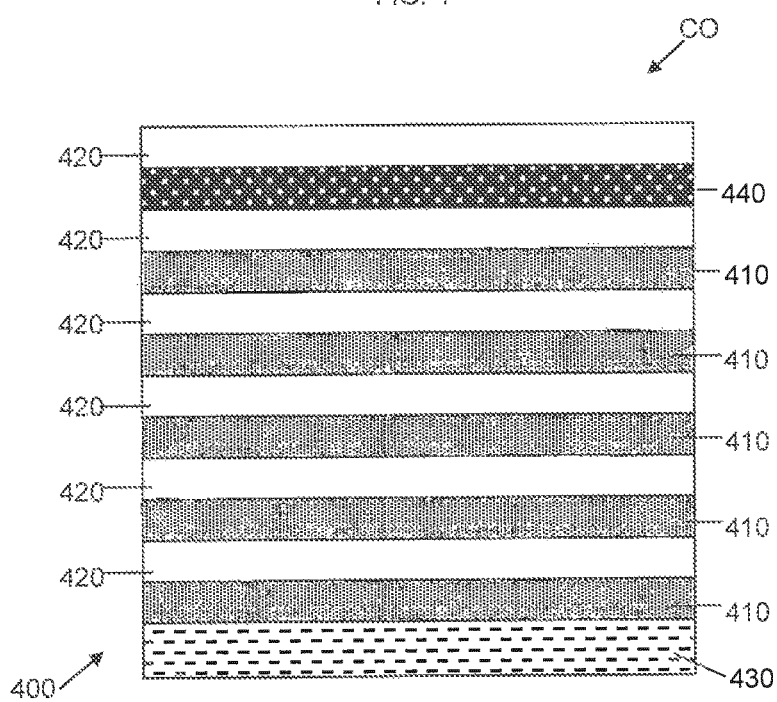
FIG. 5 schematically depicts a multi-layer mirror that may be used in the radiation source of FIG. 3 in accordance with an embodiment of the invention.

Further, while treatment of layer-pairs is considered above, treatment of individual layers can also be carried out. For example, treatment of only molybdenum layers within a molybdenum-silicon multi-layer mirror may provide a significant enhancement in blister formation resistance. Hydrogen incorporation in molybdenum layers during exposure of multi-layer mirrors to hydrogen plasmas has been shown to be of particular importance, with higher concentrations of hydrogen being observed in molybdenum layers than in silicon layers in subsequent analysis. Therefore, treatment of just molybdenum layers may provide a satisfactory improvement. FIG. 5 shows an embodiment in which a multi-layer mirror 400 includes a plurality of layers of silicon 420, and a plurality of layers of molybdenum 410. The multi-layer mirror 400 includes a single doped molybdenum layer 440, which is the uppermost molybdenum layer.

Figure 6:
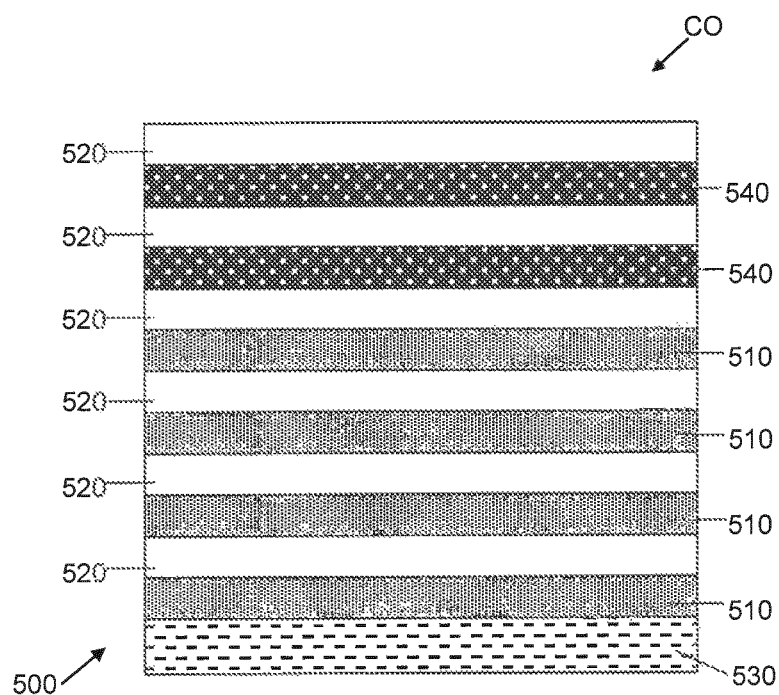
FIG. 6 schematically depicts a multi-layer mirror that may be used in the radiation source of FIG. 3 in accordance with an embodiment of the invention.

FIG. 6 shows a further alternative embodiment in which a multi-layer mirror 500 includes a plurality of layers of silicon 520, and a plurality of layers of molybdenum 510. The multi-layer mirror 500 includes two doped molybdenum layers 540, which are the uppermost molybdenum layers. It will be appreciated that in further embodiments a plurality of molybdenum layers may be doped. In some embodiments every molybdenum layer within a multi-layer mirror may be doped.

Figure 7:
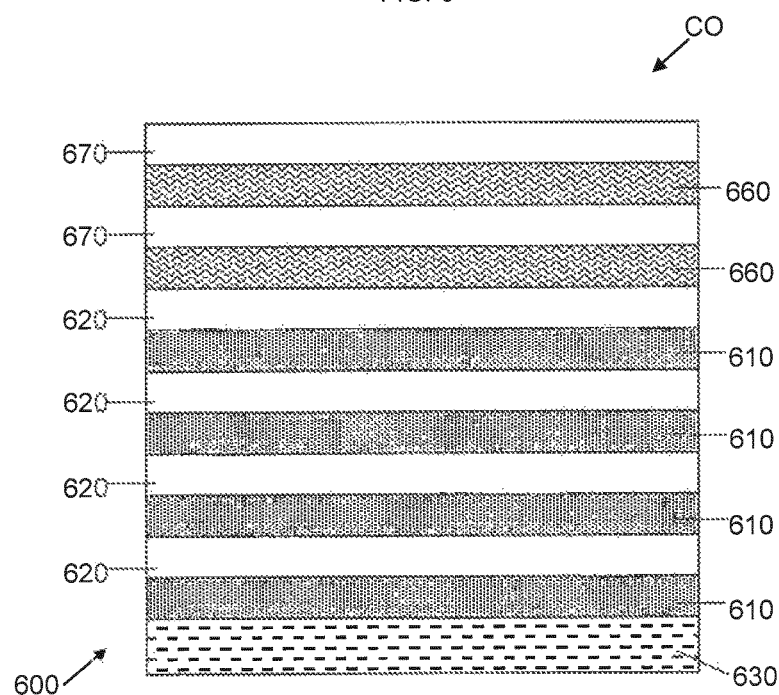
FIG. 7 schematically depicts a multi-layer mirror that may be used in the radiation source of FIG. 3 in accordance with an embodiment of the invention.

FIG. 7 shows a further alternative embodiment in which a multi-layer mirror 600 comprises a molybdenum-silicon multi-layer stack, followed by a further multi-layer stack of alternative materials, such as, for example a carbon-silicon multi-layer stack. The multi-layer mirror 600 includes a plurality of layers of silicon 620, and a plurality of layers of molybdenum 610. In such an embodiment, any or all of the layers of the multi-layer stack may be doped. For example, the molybdenum-silicon multi-layer stack shown in FIG. 7 consists of a plurality of un-doped molybdenum layers 610 and un-doped silicon layers 620. The multi-layer mirror 600 further includes a carbon-silicon multi-layer stack that consists of doped carbon layers 660 and un-doped silicon layers 670.

The multi-layer mirror 600 includes two doped carbon layer 660, which are the uppermost carbon layers. It will be appreciated that in further embodiments a single carbon layer may be doped. The silicon layers 670 are not doped. However, in an alternative embodiment, one or more of the silicon layers 670 may be doped. Alternatively, the carbon-silicon multi-layer stack may consist of further carbon-silicon layer pairs, one or more of the constituent layers or layer-pairs of which may be doped. In some embodiments every silicon layer within a multi-layer mirror may be doped.

Figure 8:
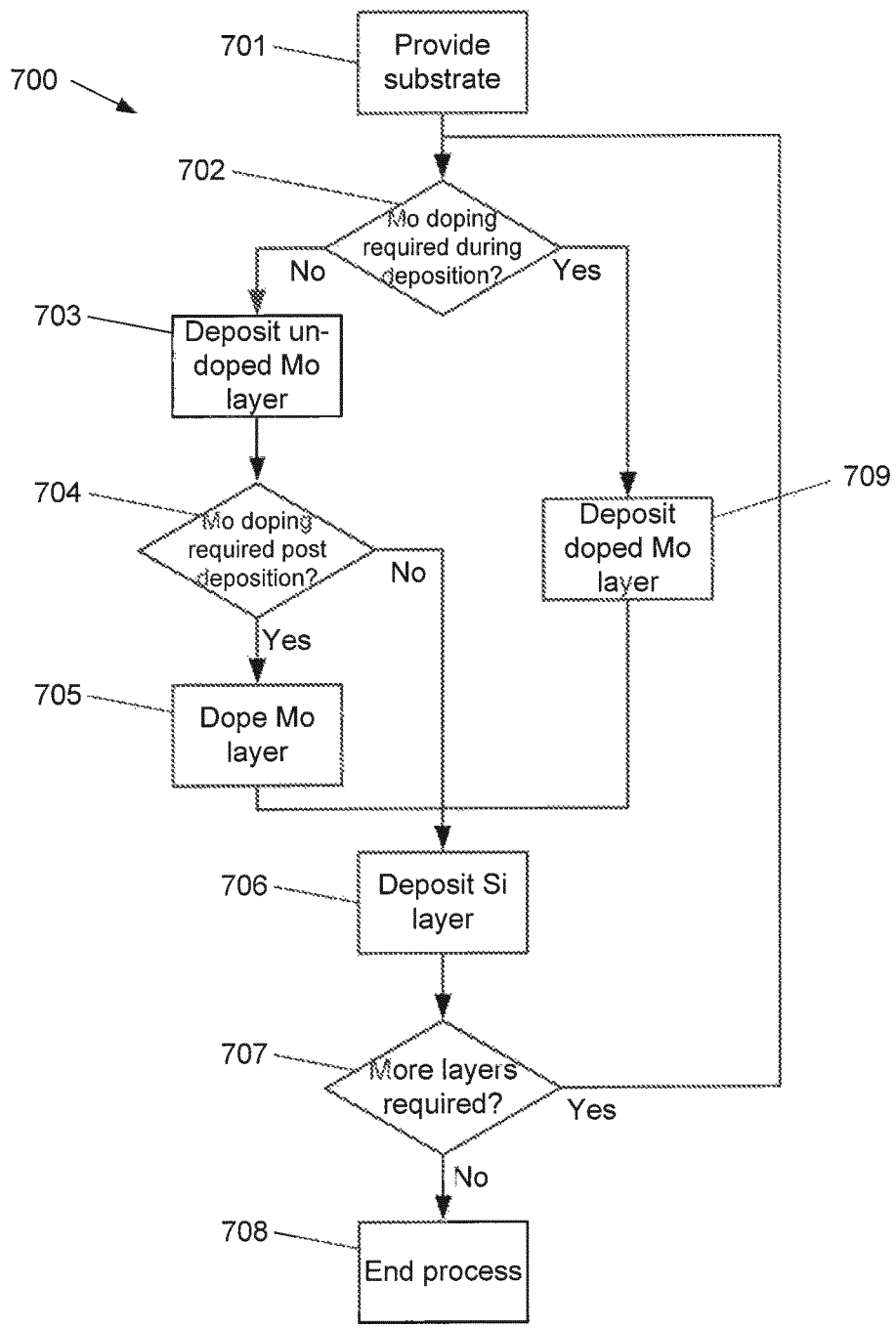
FIG. 8 shows the steps of a method that may be used in the manufacture of a multi-layer mirror in accordance with an embodiment of the invention.

FIG. 8 shows a procedure 700 that may be used to manufacture a mirror a multi-layer mirror having the architecture depicted in FIG. 5 or 6. Initially a substrate is provided at step 701. Next a molybdenum layer is deposited. However, first it is decided whether the layer should be doped or not, at step 702. If the molybdenum layer will not be doped, then the procedure passes to step 703 where an un-doped molybdenum layer is deposited. Following the deposition of an un-doped molybdenum layer, a further decision is made, at step 704, as to whether the un-doped molybdenum layer should be doped post-deposition. If the un-doped molybdenum layer should be doped, then the procedure moves on to step 705, where the un-doped molybdenum layer is doped. The procedure then passes to step 706 where a silicon layer is deposited. Alternatively, if the un-doped molybdenum layer should remain un-doped, then the doping step 705 does not occur, and the procedure passes directly from step 704 to step 706. After deposition of the silicon layer at step 706, a further decision is made at step 707 as to whether further layers are required. If yes, then the procedure passes back to step 702, and the process is repeated. If no, then the procedure ends at step 708.

Alternatively, if the decision at step 702 is that the molybdenum layer should be doped, then the procedure passes to step 709, where a doped molybdenum layer is deposited. The procedure then passes directly to step 706, where a silicon layer is deposited.

It will be appreciated that the procedure 700 may be used to deposit multi-layer mirrors consisting of any number of pairs of molybdenum and silicon layers. Further, while procedure 700 shows only the doping of one or more molybdenum layers within a multi-layer mirror including both molybdenum and silicon layers, it will be appreciated that both silicon and molybdenum layers could be doped in a single procedure. The deposition of silicon at step 706 of procedure 700 could incorporate steps equivalent to those associated with the deposition and doping of molybdenum described by steps 702, 703, 704, 705 and 709 of procedure 700.

In this way, a multi-layer mirror incorporating both doped and un-doped silicon layers, and both doped and un-doped molybdenum layers, as shown in FIG. 4 could be deposited by the procedure shown in FIG. 8.

Further, a procedure similar to that shown in FIG. 8 could be used to deposit composite molybdenum-silicon and carbon-silicon multi-layer mirrors as described above with reference to FIG. 7.

While multi-layer stacks consisting of only pairs of layers are described, embodiments of the invention may include additional intermediate layers between the pairs of layers, or between layers of a single pair, and still be regarded as a multi-layer stack of pairs of alternating layers of a first material and silicon. For example each layer-pair of molybdenum and silicon may be separated by an intermediate layer. The intermediate layer may, for example, act as a diffusion barrier that may prevent further diffusion of hydrogen between the adjacent layer-pairs. A diffusion barrier layer may consist of a layer of, for example, boron carbide. Alternatively, intermediate layers may be incorporated for other purposes.

It is also possible to treat layers at different depths to a differing degree. While the uppermost layers may be treated such that they are effectively saturated with dopant species, to the extent that they cannot incorporate additional hydrogen during use, it may be possible to reduce the doping density of subsequent (lower) layers while retaining an adequate performance enhancement. In this way the uppermost layer-pair may be treated at 100% of the level required to saturate dopant inclusion (e.g., 40 at. % hydrogen in molybdenum, and 30 at. % hydrogen in silicon), whereas the second layer-pair may be treated at 80% of that level (e.g., 32 at. % hydrogen in molybdenum, and 24 at. % hydrogen in silicon). A third layer-pair may be treated at 60% of the saturation level, and so on until the sixth layer-pair receives no treatment.

A further consideration when determining the number of layers that should be doped is the wavelength of the EUV, which is incident upon the mirror. For example, a mirror optimized for high reflectivity at 13.5 nm may have a layer structure that has a particularly advantageous number of doped layers. However, adjustments made to a mirror that is optimized for high reflectivity at another EUV wavelength (e.g., 5 nm) may require a different number of layers to be doped to achieve the same degree of protection from incident hydrogen.

Figure 9:
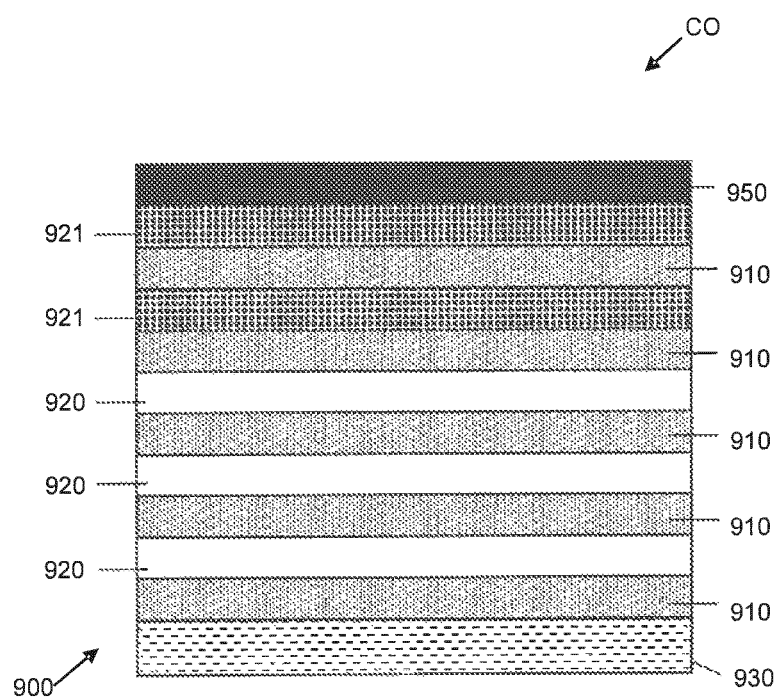
FIG. 9 schematically depicts a multi-layer mirror that may be used in the radiation source of FIG. 3 in accordance with an embodiment of the invention.

FIG. 9 schematically illustrates a further embodiment of a collector mirror 900 forming part of the normal incidence collector optic CO of FIG. 3. As illustrated, the collector optic CO includes a multi-layer mirror 900 comprising a plurality of layers of silicon 920, a plurality of layers of molybdenum 910 and a substrate 930. FIG. 9 is merely a schematic illustration of the collector mirror 900. In common with other illustrated embodiments, the collector mirror 900 may comprise many more layers of silicon 920 and many more layers of molybdenum 910 than are depicted. The multi-layer mirror 900 includes two doped silicon layers 921, which are the uppermost silicon layers. The doped silicon layers 921 are doped with a first metallic dopant. The first metallic dopant may comprise one or more of W, Ti, V, Zr, Ni, Cu, Al, Cr, Au, Ag, Fe and Sn or may be another metallic dopant. The concentration of the first metallic dopant in the doped silicon layers 921 may be up to 15 at. %.

The multi-layer mirror 900 is further provided with a capping layer 950. The capping layer 950 may, for example, be a layer of SiNx or a layer of diamond like carbon. The capping layer 950 may be doped with a second metallic dopant. The second metallic dopant may comprise one or more of W, Ti, V, Zr, Ni, Cu, Al, Cr, Au, Ag, Fe and Sn or may be another metallic dopant. The concentration of the second metallic dopant in the capping layer 950 may be up to 15 at. %. The first and second metallic dopants may be the same as each other or may differ from one another.

Manufacture of the multi-layer mirror 900 may be carried out by delivering at least the doped silicon layers 921 and/or the capping layer 950 through a process of magnetron sputtering. An independent magnetron sputtering device may be used to deliver the first and/or second metallic dopants to the multilayer mirror 900 whilst another magnetron sputtering device is used to simultaneously deliver silicon and/or the capping layer 950 to the multi-layer mirror 900. Alternatively a magnetron sputtering device may be used to deliver silicon, which has already been doped with the first metallic dopant, to the multi-layer mirror 900. A magnetron sputtering device may be used to deliver the capping layer 950, which has already been doped with the second metallic dopant, to the multi-layer mirror 900. The doped silicon layers 921 and/or the capping layer 950 may be further prepared through an ion polishing/densification step. An ion polishing/densification step may ensure that the doped silicon layers 921 and/or the capping layer 950 are of a high quality, for example by reducing the number of pores and/or defects in these layers. Preparation of the doped silicon layers 921 and/or the capping layer 950 may additionally or alternatively include an annealing step that may be carried out, for example, using a laser. An annealing step may lead to the formation of chemical compounds in the doped silicon layers 921 and/or the capping layer 950, which reduce the tendency of these layers to retain hydrogen.

Doping of one or more silicon layers 921 and/or a capping layer 950 with metallic dopants may significantly reduce the amount of hydrogen that may be accepted into the silicon layers 921 and/or the capping layer 950 during use of the multi-layer mirror 900. Metallic dopants may therefore act to block hydrogen from being unintentionally included into the multi-layer mirror 900 during use. This may reduce or eliminate the risk of blistering or degradation of the multi-layer mirror 900, caused by hydrogen.

Prior art capping layers may suffer from significant etching of the capping layers after exposure to the harsh operating conditions found within an EUV source (e.g., the presence of a hydrogen plasma). Doping of carbon with one or more metallic dopants may substantially reduce the etching rate of the carbon in the presence of hydrogen. For example, a capping layer 950 comprising diamond like carbon that is doped with one or more metallic dopants may be substantially more resistant to etching than prior art capping layers.

A metallic dopant may act as a catalyst to the desorption of hydrogen from silicon. Doping a silicon layer with a metallic dopant may therefore lower the desorption temperature of hydrogen from the silicon layer. For example, the desorption temperature of hydrogen from the doped silicon layers 921 may be reduced by the first metallic dopant used to dope the silicon layers 921. The reduction of the desorption temperature of hydrogen from the doped silicon layers 921 may enable the use of an annealing step to remove hydrogen from the doped silicon layers 921. For example during a period of exposure to the harsh operating conditions found within an EUV source (e.g., the presence of a hydrogen plasma), some hydrogen may breach the capping layer 950 and may be absorbed into one or more of the doped silicon layers 921. The hydrogen may be cleaned from the doped silicon layers by exposing the multi-layer mirror 900 to an annealing step. The annealing step may, for example, comprise exposing the multi-layer mirror 900 to a laser beam that may heat the multi-layer mirror 900. The laser beam may heat the doped silicon 921 to a temperature higher than the desorption temperature of hydrogen from the doped silicon 921 and may therefore remove hydrogen from the doped silicon 921. Reducing the desorption temperature of hydrogen from the doped silicon 921 by doping the silicon layers 921 with a metallic dopant may enable an annealing step to heat the doped silicon 921 to a temperature that is above the desorption temperature of hydrogen from the doped silicon 921, without exposing the multi-layer mirror 900 to damaging heat loads. An annealing step to clean hydrogen from the doped silicon layers 921 may be performed inside the lithographic apparatus using a laser that is integrated into the lithographic apparatus. Alternatively, the multi-layer mirror 900 may be removed from the lithographic apparatus and an annealing step to clean hydrogen from the doped silicon layers 921 may be performed outside of the lithographic apparatus.

The presence of a capping layer 950, which is doped with a second metallic dopant, may additionally lower the desorption temperature of hydrogen from the doped silicon 921. The second metallic dopant may diffuse from the capping layer 950 into the doped silicon layers 921 and act as a catalyst to the desorption of hydrogen from the silicon. The doped capping layer 950 may therefore further enable an annealing step to clean hydrogen from the doped silicon layers 921.

Although a multi-layer mirror 900 has been described having two doped silicon layers 921 it should be appreciated that embodiments of the invention may comprise a single doped silicon layer 921. Further embodiments of the invention may comprise more than two doped silicon layers 921. For example some embodiments may comprise three, four or more doped silicon layers 921. The molybdenum layers 910 may also be doped. For example, the molybdenum layers 910 may be doped with hydrogen, a noble gas or helium as described above in relation to other embodiments of the invention.

The capping layer 950 may be doped with a metallic dopant. Alternatively the capping layer 950 may be undoped or may be doped with a non-metallic material as may be known in the art. In some embodiments of the invention a multi-layer mirror may have no capping layer 950.

Although described in the context of collector optics, it should be understood that embodiments of the invention may be used for any multi-layer mirror.

Although reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The term "lens," where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein. The descriptions above are intended to be illustrative, not limiting. Thus it will be apparent to one skilled in the art that modifications may be made to the invention as described without departing from the scope of the claims and clauses set out below.

CLAUSES

1. A method of manufacturing a multi-layer mirror comprising a multi-layer stack of pairs of alternating layers of a first material and a second material, the method comprising:
depositing a stack of pairs of alternating layers of the first material and layers of the second material, the stack being supported by a substrate; and
doping at least a first layer of the first material with a first metallic dopant.

2. The method according to clause 1, further comprising depositing a capping layer on the multi-layer mirror.

3. The method according to clause 2, further comprising doping the capping layer with a second metallic dopant.

4. The method according to clause 3, wherein the first metallic dopant is different from the second metallic dopant.

5. The method according to any one of clauses 1 to 4, wherein the first metallic dopant comprises one or more of W, Ti, V, Zr, Ni, Cu, Al, Cr, Au, Ag, Fe and Sn.

6. The method according to any one of clauses 3 to 5, wherein the second metallic dopant comprises one or more of W, Ti, V, Zr, Ni, Cu, Al, Cr, Au, Ag, Fe and Sn.

7. The method of clause 6, wherein the first material comprises silicon.

8. The method of clause 7, wherein the second material comprises molybdenum.

9. A multi-layer mirror comprising a multi-layer stack of pairs of alternating layers of a first material and a second material, the stack being supported by a substrate, wherein at least a first layer of the first material is doped with a first metallic dopant.

10. The multi-layer mirror of clause 9, further comprising a capping layer.

11. The multi-layer mirror of clause 10, wherein the capping layer is doped with a second metallic dopant.

12. The multi-layer mirror of clause 11, wherein the first metallic dopant is different from the second metallic dopant.

13. The multi-layer mirror according to any one of clauses 9 to 12, wherein the first metallic dopant comprises one or more of W, Ti, V, Zr, Ni, Cu, Al, Cr, Au, Ag, Fe and Sn.

14. The multi-layer mirror according to clause 11 or 12, wherein the second metallic dopant comprises one or more of W, Ti, V, Zr, Ni, Cu, Al, Cr, Au, Ag, Fe and Sn.

15. The multi-layer mirror according to any one of clauses 9 to 14, wherein the first material comprises silicon.

16. The multi-layer mirror according to any one of clauses 9 to 15, wherein the second material comprises molybdenum.

The invention claimed is:
1. A method of manufacturing an extreme ultraviolet (EUV) multi-layer mirror, the method comprising:

disposing, on a substrate, a stack of alternating layers of a first material and silicon, the first material comprising molybdenum and a refractive index corresponding to a reflective property of the EUV multi-layer mirror at a wavelength of EUV radiation; and doping a layer of the first material from among the stack of alternating layers of the first material and silicon with a dopant material comprising hydrogen during growth of the layer of the first material, wherein the dopant material in the layer of the first material has a concentration between 20 atomic percent and 40 atomic percent to provide resistance to unintentional inclusion of hydrogen in the stack during operation of the EUV multi-layer mirror.

2. The method according to claim 1, wherein the doping comprises incorporating a noble gas into the layer of the first material.

3. The method according to claim 2, wherein the doping comprises incorporating up to 10 atomic percent of the noble gas into the layer of the first material.

4. The method according to claim 1, wherein the doping comprises exposing the layer of the first material to hydrogen plasma during growth of the layer of the first material.

5. The method according to claim 1, wherein the doping comprises saturating the layer of the first material with the dopant material.

6. The method according to claim 1, wherein the doping comprises exposing the layer of the first material to a noble gas plasma or ion beam during growth of the layer of the first material.

7. The method according to claim 1, wherein the disposing comprises disposing the layer of the first material as the uppermost layer in the stack of alternating layers of the first material and silicon.

8. The method according to claim 1, further comprising doping a silicon layer from among the stack of alternating layers of the first material and silicon with hydrogen.

9. The method according to claim 8, wherein the doping of the silicon layer comprises incorporating between 10 atomic percent and 30 atomic percent hydrogen into the silicon layer.

10. The method according to claim 8, wherein the doping of the silicon layer comprises incorporating hydrogen into the silicon layer during growth of the silicon layer.

11. An extreme ultraviolet (EUV) multi-layer mirror comprising:

a multi-layer stack of alternating layers of a first material and silicon, wherein:

the first material comprises molybdenum and a refractive index corresponding to a reflective property of the EUV multi-layer mirror for a wavelength of EUV radiation, the multi-layer stack comprises a layer of the first material having a dopant material comprising hydrogen, and the dopant material in the layer of the first material has a concentration between 20 atomic percent and 40 atomic percent to provide resistance to unintentional inclusion of hydrogen in the multi-layer stack during operation of the EUV multi-layer mirror; and a substrate configured to support the multi-layer stack.

12. The EUV multi-layer mirror according to claim 11, wherein the layer of the first material comprises a noble gas dopant.

13. The EUV multi-layer mirror according claim 11, wherein the layer of the first material comprises a noble gas dopant having a concentration of up to 10 atomic percent.

14. The EUV multi-layer mirror according to claim 11, wherein a silicon layer from among the multi-layer stack of alternating layers of the first material and silicon comprises a hydrogen dopant.

15. The EUV multi-layer mirror according to claim 14, wherein the silicon layer comprises a hydrogen dopant having a concentration between 10 atomic percent and 30 atomic percent.

16. The EUV multi-layer mirror according to claim 11, further comprising a capping layer, disposed on the multi-layer stack, having a metal dopant.

17. A lithographic apparatus comprising:

an extreme ultraviolet (EUV) radiation source configured to generate an EUV radiation beam;

an illumination system configured to condition the EUV radiation beam;

a projection system configured to project the conditioned EUV radiation beam onto a target portion of a substrate; and an EUV multi-layer mirror comprising a multi-layer stack of alternating layers of a first material and silicon, wherein:

the first material comprises molybdenum and a refractive index corresponding to a reflective property of the EUV multi-layer mirror for a wavelength of EUV radiation;

the multi-layer stack comprises a layer of the first material having a dopant material comprising hydrogen; and the dopant material in the layer of the first material has a concentration between 20 atomic percent and 40 atomic percent to provide resistance to unintentional inclusion of hydrogen in the multi-layer stack during operation of the EUV multi-layer mirror in the lithographic apparatus.

* * * * *